US008824148B2

(12) United States Patent
Kim

(10) Patent No.: US 8,824,148 B2
(45) Date of Patent: Sep. 2, 2014

(54) SHOCK PREVENTION APPARATUS OF MEDIUM CASSETTE AND FINANCIAL DEVICE

(75) Inventor: Dowan Kim, Busan (KR)

(73) Assignee: LG CNS Co., Ltd., Seoul (KR)

( * ) Notice: Subject to any disclaimer, the term of this patent is extended or adjusted under 35 U.S.C. 154(b) by 372 days.

(21) Appl. No.: 13/198,887

(22) Filed: Aug. 5, 2011

(65) Prior Publication Data

US 2012/0037580 A1    Feb. 16, 2012

(30) Foreign Application Priority Data

Aug. 13, 2010   (KR) .................. 10-2010-0078439

(51) Int. Cl.
*H05K 7/14* (2006.01)
*H05K 7/18* (2006.01)

(52) U.S. Cl.
CPC .............. *H05K 7/1488* (2013.01); *H05K 7/14* (2013.01); *H05K 7/18* (2013.01)
USPC ........................................ 361/728; 211/13.1

(58) Field of Classification Search
CPC .......... H05K 7/14; H05K 7/1488; H05K 7/18
USPC ................. 361/728, 807; 211/1, 13.1, 26
See application file for complete search history.

(56) References Cited

U.S. PATENT DOCUMENTS

| 5,209,356 | A  | * | 5/1993  | Chaffee ........................ 211/26 |
| 7,729,112 | B2 | * | 6/2010  | Atkins ..................... 361/679.34 |
| 7,740,116 | B2 | * | 6/2010  | Cultraro ........................ 188/294 |
| 7,889,492 | B2 | * | 2/2011  | Chen et al. ............... 361/679.36 |
| 8,042,660 | B2 | * | 10/2011 | Cultraro ........................ 188/293 |
| 8,079,450 | B2 | * | 12/2011 | Zeilenga et al. .............. 188/290 |
| 8,286,764 | B2 | * | 10/2012 | Weber et al. .................. 188/294 |
| 8,411,446 | B2 | * | 4/2013  | Becklin ........................ 361/730 |
| 8,550,453 | B2 |   | 10/2013 | Cost |
| 2004/0105655 | A1 | * | 6/2004 | Ciulla ............................ 386/46 |
| 2008/0237156 | A1 | * | 10/2008 | Cheng-Yuan et al. .......... 211/26 |
| 2010/0264580 | A1 |   | 10/2010 | Saltsov et al. |

FOREIGN PATENT DOCUMENTS

| CN | 2541907 Y     | 3/2003 |
| CN | 16-22139 A    | 6/2005 |
| CN | 201191421 Y   | 2/2009 |
| CN | 10-1743571 A  | 6/2010 |
| KR | 10-2006-0117403 A | 11/2006 |

OTHER PUBLICATIONS

Office Action dated Oct. 26, 2011 in Korean Application No. 10-2010-0078439, filed Aug. 13, 2010.
Office Action dated May 2, 2013 in Chinese Application No. 201110229508.5, filed Aug. 11, 2011.

* cited by examiner

*Primary Examiner* — Michael Safavi
(74) *Attorney, Agent, or Firm* — Saliwanchik, Lloyd & Eisenschenk

(57) ABSTRACT

Provided is a financial device, which comprises a medium cassette, a cassette box, and a shock prevention apparatus. The medium cassette accommodates a medium. The medium cassette is installed on the cassette box. The shock prevention apparatus is disposed between a portion of the medium cassette and a portion of the cassette box facing the portion of the medium cassette. The shock prevention apparatus prevents a shock from being applied to the medium cassette while the medium cassette is installed on the cassette box.

13 Claims, 3 Drawing Sheets

SHOCK PREVENTION APPARATUS OF MEDIUM CASSETTE AND FINANCIAL DEVICE

CROSS-REFERENCE TO RELATED APPLICATION

This application claims the benefit under 35 U.S.C. §119 of Korean Patent Application No. 10-2010-0078439, filed on Aug. 13, 2010, which is hereby incorporated by reference in its entirety.

BACKGROUND

Embodiments relate to a shock prevention apparatus of a medium cassette, and a financial device.

Generally, financial devices are devices that process a financial transaction a customer desires. The financial devices deposit/withdraw a medium or automatically transfer the medium. Such a financial device may comprise a medium cassette in which media are stacked. The medium cassette may be installed on a cassette box.

When a medium cassette is installed on a cassette box, the weight of media accommodated in the medium cassette is added to the weight of the medium cassette. At this point, the user may unintentionally drop the medium cassette before the medium cassette is completely installed on the cassette box. Accordingly, the medium cassette freely falls and collides with the bottom of the cassette box, and a shock due to the free fall may damage mechanical or electronic parts on the medium cassette.

BRIEF SUMMARY

Embodiments provide a shock prevention apparatus of a medium cassette, and a financial device.

In one embodiment, a financial device comprises: a medium cassette configured to accommodate a medium; a cassette box on which the medium cassette is installed; and a shock prevention apparatus provided between a portion of the medium cassette and a portion of the cassette box facing the portion of the medium cassette, wherein the shock prevention apparatus prevents a shock from being applied to the medium cassette while the medium cassette is installed on the cassette box.

In another embodiment, a shock prevention apparatus of a medium cassette comprises: a rack gear provided to the medium cassette accommodating a medium; and a connecting mechanism provided to a cassette box on which the medium cassette is installed, wherein the rack gear rotates the connecting mechanism while the medium cassette is installed on cassette box.

The details of one or more embodiments are set forth in the accompanying drawings and the description below. Other features will be apparent from the description and drawings, and from the claims.

DETAILED DESCRIPTION

Figure 1:
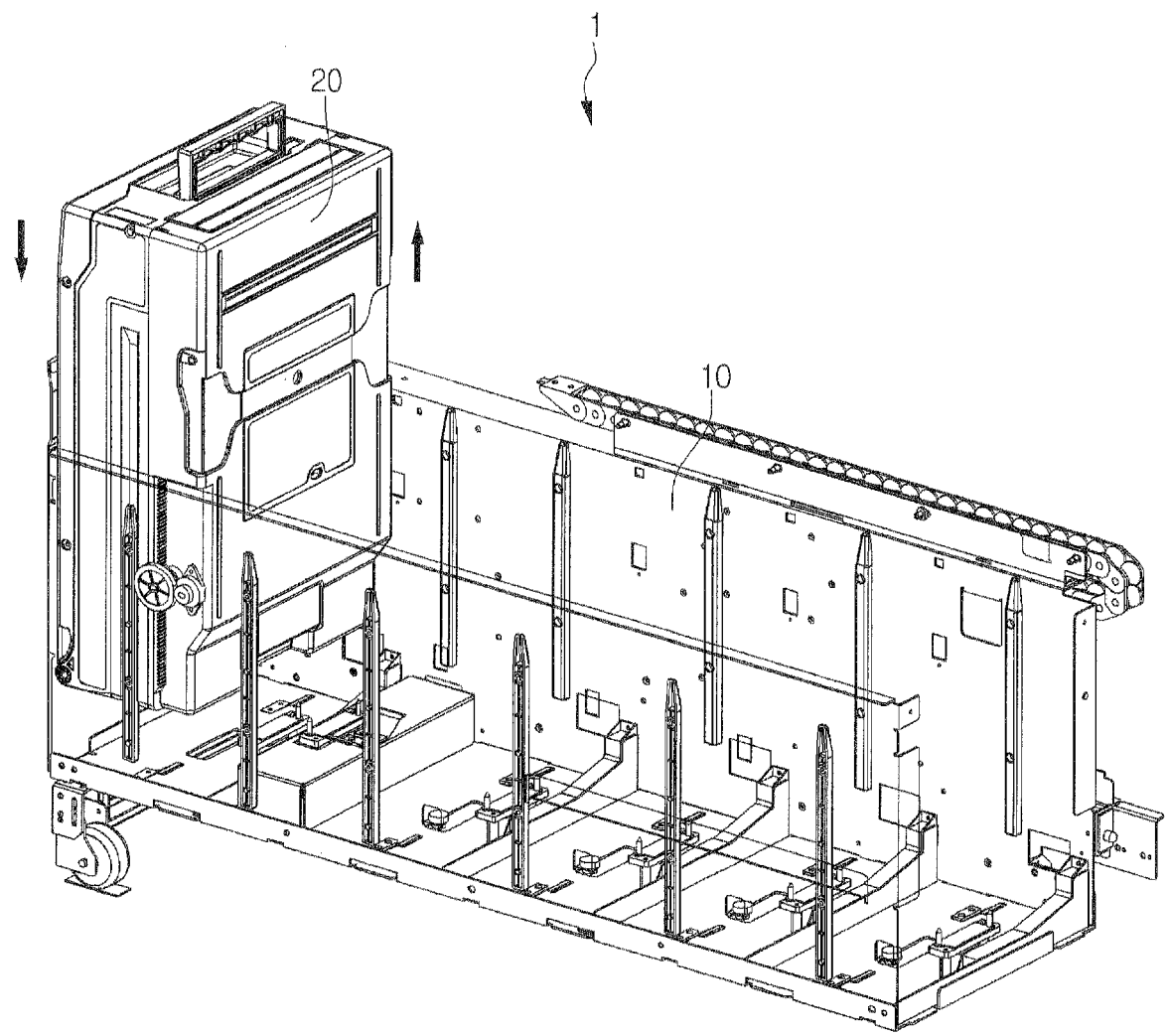
FIG. 1 is a perspective view illustrating a financial device according to a first embodiment.

Hereinafter, exemplary embodiments of the present disclosure will be described with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

Also, in the description of embodiments, terms such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, the former may be directly "connected", "coupled," and "joined" to the latter or "connected", "coupled", and "joined" to the latter via another component.

A financial device according to embodiments is a device that performs financial businesses, i.e., medium processing comprising processing such as deposit processing, giro receipt, or gift certificate exchange and/or processing such as withdrawal processing, giro dispensing, or gift certificate dispensing by receiving various medium such as, e.g., paper moneys, bills, giros, coins, gift certificates, etc. For example, the financial device may comprise an automatic teller machine (ATM) such as a cash dispenser (CD) or a cash recycling device. However, the financial device is not limited to the above-described examples. For example, the financial device may be a device for automatically performing the financial businesses such as a financial information system (FIS).

Hereinafter, assuming that the financial device is the ATM, an embodiment will be described. However, this assumption is merely for convenience of description, and technical idea of the present disclosure is not limited to the ATM.

Figure 2:
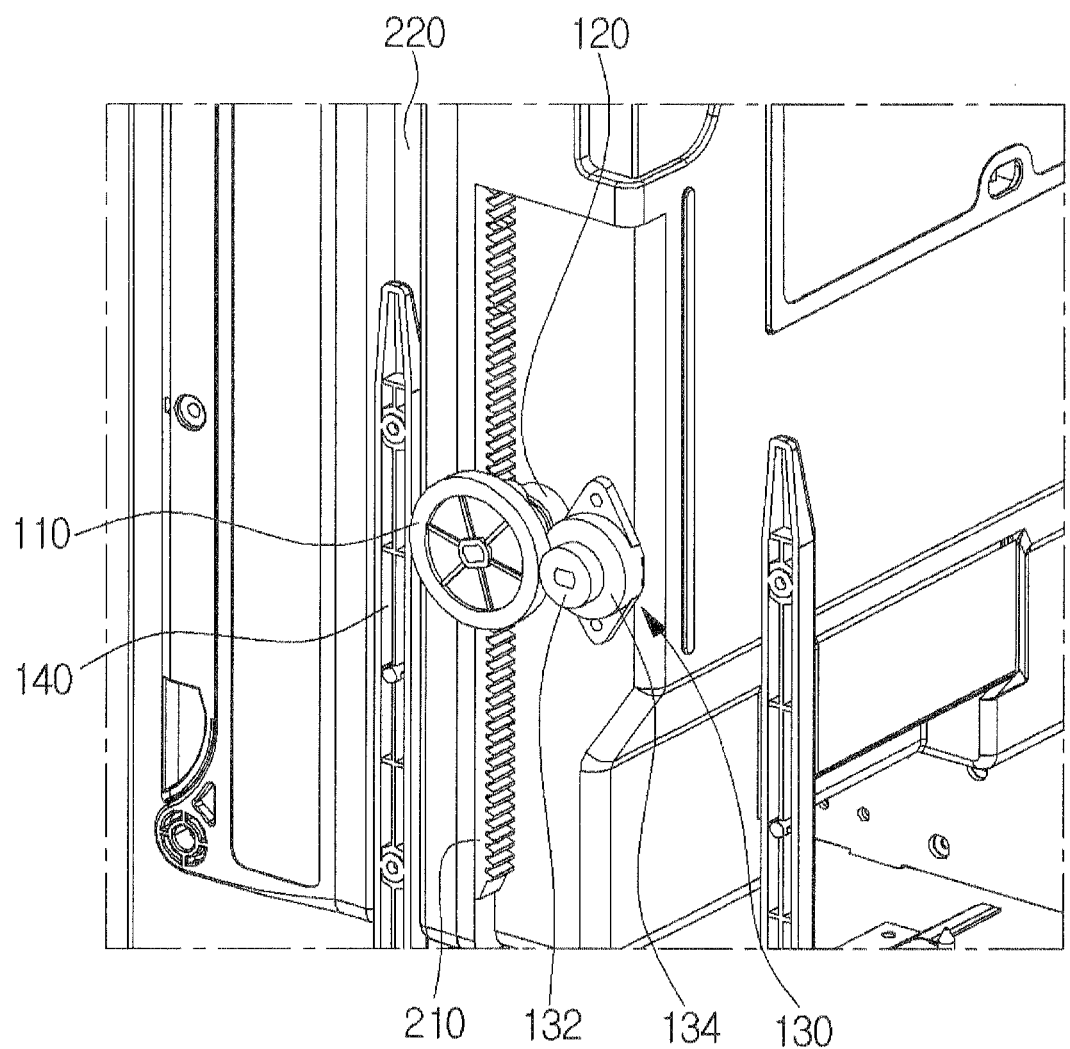
FIG. 2 is a perspective view illustrating a shock prevention apparatus of a medium cassette according to the first embodiment.

FIG. 1 is a perspective view illustrating a financial device according to a first embodiment. FIG. 2 is a perspective view illustrating a shock prevention apparatus of a medium cassette according to the first embodiment.

Referring to FIG. 1, a medium cassette 20 is installed on a cassette box 10.

Referring to FIGS. 1 and 2, a financial device 1 may comprise at least one medium cassette 20, the cassette box 10 on which the medium cassette 20 is removably installed, and a shock prevention apparatus for preventing a shock from being applied to the medium cassette 20 when the medium cassette 20 is installed on the cassette box 10.

As illustrated in FIG. 1, the cassette box 10 has a configuration to receive a plurality of the medium cassettes 20.

The medium cassette 20 may have an approximately hexahedron shape. The medium cassette 20 has an inner stacking space in which media are stacked.

The cassette box 10 may be disposed in the financial device 1, and accommodate the medium cassettes 20. The cassette box 10 may be formed of a metal or plastic. The cassette box 10 has a top opening through which the medium cassette 20 vertically slides to be installed on or removed from the cassette box 10. However, an installing direction of the medium cassette 20 to the cassette box 10 is not limited thereto. For example, the medium cassette 20 may horizontally move to be installed on the cassette box 10.

At least one surface of the medium cassette 20 is provided with an insert guiding recess 220. The insert guiding recess 220 extends in the installing direction of the medium cassette 20. A lower end of the insert guiding recess 220 increases in width downward with a slope.

The cassette box 10 comprises an insert guide 140 that is inserted in the insert guiding recess 220. The insert guide 140 protrudes from the inner surface of the cassette box 10, and extends in the installing direction of the medium cassette 20. An upper end of the insert guide 140 decreases in width upward with a slope.

Accordingly, when the medium cassette 20 is installed on the cassette box 10, the lower end of the insert guiding recess 220, which increases in width downward, and the upper end of the insert guide 140, which decreases in width upward, guide the medium cassette 20 to a desired position of the cassette box 10, and help accurate engagement between a rack gear 210 and an inner gear 120 to be described later.

Although the medium cassette 20 and the cassette box 10 are provided with the insert guiding recess 220 and the insert guide 140, respectively, the medium cassette 20 and the cassette box 10 may be provided with the insert guide 140 and the insert guiding recess 220, respectively.

The rack gear 210 is disposed on a side surface of the medium cassette 20. The rack gear 210 extends in the installing direction of the medium cassette 20. The inner gear 120 engaging with the rack gear 210 is installed on the inner surface of the cassette box 10. A one-way bearing is coupled to an inner central portion of the inner gear 120. The inner gear 120 is coaxially coupled to an outer gear 110. An end of a shaft is press-fit into the center of the outer gear 110 to rotate together with the outer gear 110, and the other end of the shaft is coupled to the one-way bearing coupled to the inner central portion of the inner gear 120.

The one-way bearing rotates in a certain direction together with the outer gear 110, and stops in the opposite direction such that the inner gear 120 freely rotates in an idle state.

A damping gear 130 is disposed at an outer end of the cassette box 10 to engage with the outer gear 110. The damping gear 130 may comprise a gear part 132 and a damping part 134. The damping part 134 is installed on the cassette box 10 to support the gear part 132. The damping part 134 is filled with a high viscosity material. The rear end of the gear part 132 engaging with the outer gear 110 is disposed in the damping part 134. Accordingly, the high viscosity material filling the damping part 134 functions as a resistance to rotation of the gear part 132.

That is, since the gear part 132 engaging with the outer gear 110 contacts the high viscosity material, only when a certain amount of load or greater is applied to the damping gear 130, the damping gear 130 rotates. Otherwise, the damping gear 130 does not rotate.

The rack gear 210, the inner gear 120, the one-way bearing, the outer gear 110, and the damping gear 130 constitute the shock prevention apparatus. The inner gear 120, the one-way bearing, and the outer gear 110 may constitute a connecting mechanism.

An operation of the shock prevention apparatus configured as described above will now be described.

When the medium cassette 20 is installed on the cassette box 10, the insert guiding recess 220 is aligned with the insert guide 140. Then, the medium cassette 20 is moved downward. At this point, the lower end of the insert guiding recess 220, which increases in width downward, and the upper end of the insert guide 140, which decreases in width upward, guide the medium cassette 20 to a desired position of the cassette box 10, so that a user do not have to try to dispose the medium cassette 20 to the desired position of the cassette box 10.

When the medium cassette 20 is installed on the cassette box 10, the rack gear 210 installed on the medium cassette 20 engages with the inner gear 120 installed on the inner surface of the cassette box 10. As the medium cassette 20 moves downward, the inner gear 120 rotates counterclockwise with respect to FIG. 2. Also, the outer gear 110, coaxially coupled to the inner gear 120 through the one-way bearing, rotates counterclockwise. At this point, the damping gear 130 engaging with the outer gear 110 applies a load to the medium cassette 20 in the opposite direction to its installing direction to prevent the medium cassette 20 from freely falling to the bottom of the cassette box 10, thereby preventing a shock due to the free fall. Thus, mechanical and electronic parts installed on the medium cassette 20 can be protected.

When the medium cassette 20 is removed from the cassette box 10, the inner gear 120 is rotated clockwise. At this point, the one-way bearing coupled to the inner gear 120 allows rotation of the inner gear 120 independently from the outer gear 110. Thus, a load from the damping gear 130 is not applied to the medium cassette 20, so that the medium cassette 20 can be easily removed from the cassette box 10.

Figure 3:
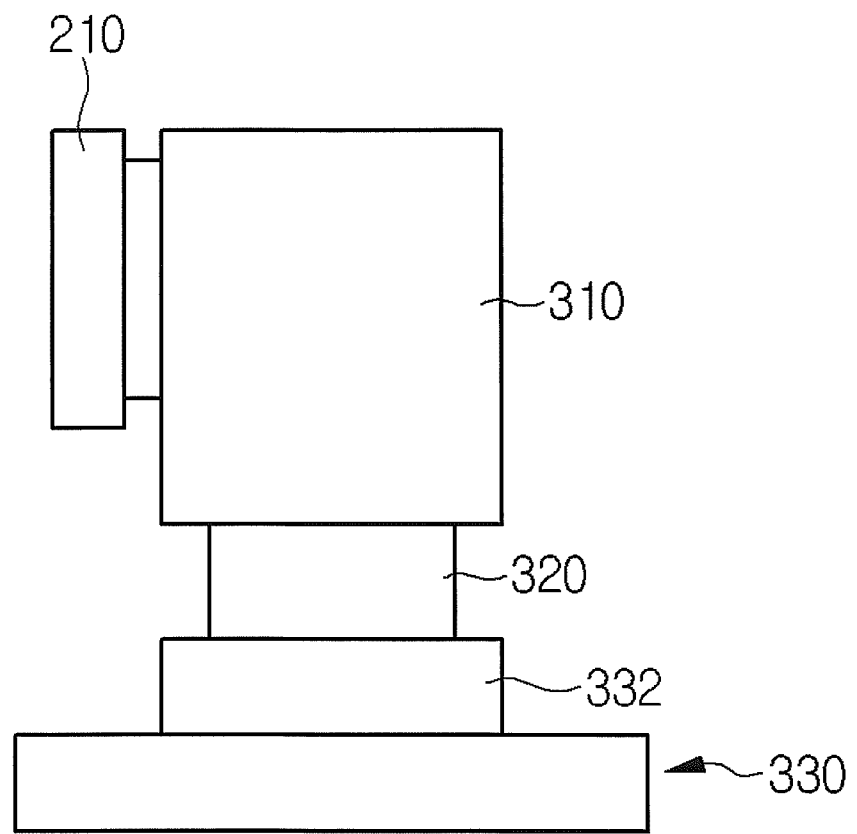
FIG. 3 is a plan view illustrating a shock prevention apparatus of a medium cassette according to a second embodiment.

FIG. 3 is a plan view illustrating a shock prevention apparatus of a medium cassette according to a second embodiment.

Referring to FIG. 3, the shock prevention apparatus according to the current embodiment comprises a rack gear 210 disposed on a medium cassette, a connecting mechanism 310 rotatably engaging with the rack gear 210, a one-way bearing 320 connected to the connecting mechanism 310, and a damping gear 330 connected to the one-way bearing 320. For example, the connecting mechanism 310 may be a gear. A gear part 332 of the damping gear 330 is connected to the one-way bearing 320.

The one-way bearing 320 rotates in a certain direction together with the connecting mechanism 310, and stops in the opposite direction such that the connecting mechanism 310 freely rotates in an idle state, independently from the damping gear 330.

According to another embodiment, a shock prevention apparatus may comprise a medium cassette provided with a rack gear, and a cassette box provided with a gear-shaped connecting mechanism engaging with the rack gear. A rotation shaft of the connecting mechanism may be provided with a torsion spring. The connecting mechanism may be adjacent to an inner lower side of the medium cassette. While the medium cassette is installed on the cassette box, the connecting mechanism is rotated to compress the torsion spring, thereby decreasing rotation speed of the connecting mechanism. Accordingly, installing speed of the medium cassette is also decreased, thereby preventing a shock to the medium cassette. On the contrary, while the medium cassette is removed from the cassette box, the torsion spring is extended, thereby facilitating the removal of the medium cassette from the cassette box.

Even though all the elements of the embodiments are coupled into one or operated in the combined state, the present disclosure is not limited to such an embodiment. That is, all the elements may be selectively combined with each other without departing the scope of the invention. Furthermore, when it is described that one comprises (or comprises or has) some elements, it should be understood that it may comprise (or comprise or has) only those elements, or it may comprise (or comprise or have) other elements as well as those elements if there is no specific limitation. Unless otherwise specifically defined herein, all terms comprising technical or scientific terms are to be given meanings understood by those skilled in the art. Like terms defined in dictionaries, generally used terms needs to be construed as meaning used in technical contexts and are not construed as ideal or excessively formal meanings unless otherwise clearly defined herein.

Although embodiments have been described with reference to a number of illustrative embodiments thereof, it will be understood by those skilled in the art that various changes in form and details may be made therein without departing from the spirit and scope of the invention as defined by the appended claims. Therefore, the preferred embodiments should be considered in descriptive sense only and not for purposes of limitation, and also the technical scope of the invention is not limited to the embodiments. Furthermore, is defined not by the detailed description of the invention but by the appended claims, and all differences within the scope will be construed as being comprised in the present disclosure.

What is claimed is:

1. A financial device comprising:
   a medium cassette configured to accommodate a medium;
   a cassette box on which the medium cassette is installed; and
   a shock prevention apparatus provided between a portion of the medium cassette and a portion of the cassette box facing the portion of the medium cassette;
   wherein the shock prevention apparatus comprises:
   a rack gear provided to the medium cassette; and
   a connecting mechanism provided to the cassette box and engaging with the rack gear;
   wherein the connecting mechanism applies a load to the rack gear in a direction opposite to an installing direction of the medium cassette while the medium cassette is being installed on the cassette box; and
   wherein the connecting mechanism does not apply a load to the rack gear while the medium cassette is being removed from the cassette box.

2. The financial device of claim 1, wherein the shock prevention apparatus further comprises a damping gear that rotatably engages with the connecting mechanism.

3. The financial device of claim 2, wherein the connecting mechanism comprises:
   an inner gear that engages with the rack gear; and
   an outer gear that is coupled to the inner gear through a one-way bearing to rotate together with the inner gear when the medium cassette is installed on the cassette box.

4. The financial device of claim 3, wherein the damping gear comprises:
   a gear part engaging with the outer gear; and
   a damping part installed on the cassette box to support the gear part.

5. The financial device of claim 2, wherein the connecting mechanism has a gear shape,
   the connecting mechanism is connected to the damping gear through a one-way bearing, and
   power is transmitted from the connecting mechanism to the damping gear when the medium cassette is installed on the cassette box.

6. The financial device of claim 1, wherein the connecting mechanism is connected to a torsion spring that is compressed when the medium cassette is installed on the cassette box.

7. The financial device of claim 1, wherein one of the medium cassette and the cassette box is provided with an insert guiding recess that guides insert of the medium cassette, and
   the other of the medium cassette and the cassette box is provided with an insert guide that is inserted in the insert guiding recess.

8. A shock prevention apparatus of a medium cassette, comprising:
   a rack gear provided to the medium cassette accommodating a medium; and
   a connecting mechanism provided to a cassette box on which the medium cassette is installed;
   wherein the rack gear rotates the connecting mechanism while the medium cassette is being installed on cassette box;
   wherein the connecting mechanism applies a load to the rack gear in a direction opposite to an installing direction of the medium cassette while the medium cassette is being installed on the cassette box; and
   wherein the connecting mechanism does not apply a load to the rack gear while the medium cassette is being removed from the cassette box.

9. The shock prevention apparatus of claim 8, further comprising a damping gear that rotatably engages with the connecting mechanism.

10. The shock prevention apparatus of claim 9, wherein the connecting mechanism comprises:
    an inner gear that engages with the rack gear; and
    an outer gear that is coupled to the inner gear through a one-way bearing to rotate together with the inner gear when the medium cassette is installed on the cassette box.

11. The shock prevention apparatus of claim 10, wherein the damping gear comprises:
    a gear part engaging with the outer gear; and
    a damping part installed on the cassette box to support the gear part.

12. The shock prevention apparatus of claim 9, wherein the connecting mechanism has a gear shape,
    the connecting mechanism is connected to the damping gear through a one-way bearing, and
    power is transmitted from the connecting mechanism to the damping gear when the medium cassette is installed on the cassette box.

13. The shock prevention apparatus of claim 8, wherein the connecting mechanism is connected to a torsion spring that is compressed when the medium cassette is installed on the cassette box.

* * * * *